(12) United States Patent
Im et al.

(10) Patent No.: US 11,514,954 B2
(45) Date of Patent: Nov. 29, 2022

(54) VARIABLE RESISTANCE MEMORY DEVICES

(71) Applicant: Samsung Electronics Co., Ltd., Suwon-si (KR)

(72) Inventors: Boram Im, Seoul (KR); Hongsoo Kim, Seongnam-si (KR); Jongkook Park, Seoul (KR); Hose Choi, Seongnam-si (KR); Hyunju Sung, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/335,520

(22) Filed: Jun. 1, 2021

(65) Prior Publication Data

US 2022/0130430 A1 Apr. 28, 2022

(30) Foreign Application Priority Data

Oct. 22, 2020 (KR) .................. 10-2020-0137306

(51) Int. Cl.
*G11C 5/06* (2006.01)
*G11C 13/00* (2006.01)

(52) U.S. Cl.
CPC .......... *G11C 5/063* (2013.01); *G11C 13/0026* (2013.01); *G11C 13/0028* (2013.01); *G11C 2213/79* (2013.01)

(58) Field of Classification Search
CPC . G11C 5/063; G11C 13/0026; G11C 13/0028; G11C 2213/79
USPC .................................................. 365/63, 148
See application file for complete search history.

(56) References Cited

U.S. PATENT DOCUMENTS

| 6,376,884 | B1 | 4/2002 | Hotta |
| 7,167,393 | B2 | 1/2007 | Oikawa et al. |
| 7,456,457 | B2 | 11/2008 | Choi |
| 9,047,952 | B2 | 6/2015 | Lee et al. |
| 9,177,962 | B2 | 11/2015 | Taniguchi |
| 2010/0181623 | A1 | 7/2010 | Im et al. |
| 2011/0141793 | A1* | 6/2011 | Kono ............... G11C 5/063 365/148 |
| 2019/0287594 | A1* | 9/2019 | Osada ............... G11C 11/161 |
| 2019/0287988 | A1* | 9/2019 | Takekida ......... H01L 27/11519 |
| 2020/0091240 | A1 | 3/2020 | Hong |

FOREIGN PATENT DOCUMENTS

KR 20100071211 A 6/2010

* cited by examiner

*Primary Examiner* — Huan Hoang
(74) *Attorney, Agent, or Firm* — Myers Bigel, P. A.

(57) ABSTRACT

An integrated circuit memory device includes a plurality of row selection transistors and a dummy row selection transistor, on a substrate. A plurality of word lines and a plurality of dummy word lines are also provided on the substrate. A plurality of memory cells are provided, which are electrically connected to corresponding ones of the plurality of word lines. A plurality of dummy memory cells are provided, which are electrically connected to corresponding ones of the plurality of dummy word lines. A first wiring structure is provided, which electrically connects a first one of the plurality of word lines to a first one of the plurality of row selection transistors, and a second wiring structure is provided, which electrically connects the plurality of dummy word lines together and to the dummy row selection transistor.

20 Claims, 13 Drawing Sheets

VARIABLE RESISTANCE MEMORY DEVICES

REFERENCE TO PRIORITY APPLICATION

This application claims priority under 35 USC § 119 to Korean Patent Application No. 10-2020-0137306, filed Oct. 22, 2020, the disclosure of which is hereby incorporated herein by reference.

BACKGROUND

1. Field

Example embodiments relate to integrated circuit devices and, more particularly, integrated circuit memory devices.

2. Description of the Related Art

In order to achieve a high degree of integration, variable resistance memory devices may utilize a cell-over-peripheral (COP) structure. Using this structure, a variable resistance memory device may include word lines, bit lines and memory cells, and each of the memory cells may be disposed adjacent a cross point of one of the word lines and one of the bit lines. The variable resistance memory device may further include dummy word lines, dummy bit lines, and dummy memory cells. Each of the dummy memory cells may be connected to the dummy word line and/or the dummy bit line. The word lines and bit lines may be electrically connected to transistors formed within a substrate. Moreover, the dummy word lines and the dummy bit lines may also be electrically connected to transistors formed within the substrate.

SUMMARY

Example embodiments provide variable resistance memory devices having high degrees of integration.

According to these example embodiments, there is provided a variable resistance memory device that may include: row selection transistors on a substrate, a dummy row selection transistor on the substrate, word lines and dummy word lines disposed over the row selection transistors and the dummy row selection transistor, bit lines disposed over the word lines and the dummy word lines, memory cell structures, dummy memory cell structures, a first wiring structure connecting one of the word lines and one of the row selection transistors to each other, and a second wiring structure connecting the dummy word lines and the dummy row selection transistor. The word lines and the dummy word lines may extend in a first direction parallel to a surface of the substrate. The bit lines may extend in a second direction perpendicular to the first direction. Each of the memory cell structures may be connected to one of the word lines and one of the bit lines. Each of the dummy memory cell structures may be connected to one of the dummy word lines and one of the bit lines. Ends of the dummy word lines may be merged together by the second wiring structure.

According to further example embodiments, there is provided a variable resistance memory device that may include: memory cells disposed at cross points of word lines and bit lines, dummy memory cells connected to dummy word lines, row selection transistors for controlling the word lines, a dummy row selection transistor for controlling the dummy word lines, a first wiring connecting the word lines and the row selection transistors, and a second wiring connecting the dummy word lines and the dummy row selection transistor. The number of the row selection transistors may be equal to the number of the word lines, but the number of the dummy row selection transistor may be smaller than the number of the dummy word lines. Ends of the second dummy word lines may also be merged together, and the second dummy row selection transistor may be electrically connected to the merged second dummy word lines.

According to additional embodiments, there is provided a variable resistance memory device that may include: memory cells disposed at cross points of word lines and bit lines, dummy memory cells connected to dummy word lines, row selection transistors for controlling the word lines, and a dummy row selection transistor for controlling the dummy word lines. Each of the row selection transistors may be connected to corresponding word lines. And, ends of the dummy word lines may be merged together. The dummy row selection transistor may be electrically connected to merged dummy word lines.

According to additional embodiments, an integrated circuit memory device may include a plurality of row selection transistors and a dummy row selection transistor, on a substrate. A plurality of word lines and a plurality of dummy word lines are also provided on the substrate. A plurality of memory cells are also provided, which are electrically connected to corresponding ones of the plurality of word lines. In addition, a plurality of dummy memory cells are provided, which are electrically connected to corresponding ones of the plurality of dummy word lines. A first wiring structure is provided, which electrically connects a first one of the plurality of word lines to a first one of the plurality of row selection transistors. A second wiring structure is provided, which electrically connects the plurality of dummy word lines together and to the dummy row selection transistor. A plurality of bit lines may also be provided, which are spaced apart vertically from the plurality of word lines and the plurality of dummy word lines, and are electrically connected to corresponding ones of the plurality of memory cells. And, a plurality of dummy bit lines may be provided, which are electrically connected to corresponding ones of the plurality of dummy memory cells, and electrically connected together.

In further embodiments, the variable resistance memory device may include a selection transistor electrically connected to a plurality of the dummy word lines. That is, a selection transistor may not be required for each of the dummy word lines. Accordingly, the overall number of the selection transistors may be decreased, and a chip size of the variable resistance memory device may also be decreased.

BRIEF DESCRIPTION OF THE DRAWINGS

Example embodiments will be more clearly understood from the following detailed description taken in conjunction with the accompanying drawings.

FIG. 1 is a block diagram showing a memory device in accordance with example embodiments;

FIG. 2 is a schematic plan view illustrating a memory cell array in a variable resistance memory device in accordance with example embodiments;

FIG. 3 is a cross-sectional view illustrating parts of a memory cell array and a peripheral circuit in a variable resistance memory device in accordance with example embodiments;

FIG. 4 is a circuit diagram illustrating an example of a memory cell array in a variable resistance memory device in accordance with example embodiments;

FIG. 5 is a circuit diagram of a portion of a variable resistance memory device in accordance with example embodiments;

FIG. 6 is a circuit diagram of a portion of a variable resistance memory device in accordance with example embodiments;

FIGS. 7 to 11 are layout diagrams illustrating a part of a variable resistance memory device; and FIGS. 12 and 13 are cross-sectional views illustrating a variable resistance memory device including memory cell arrays in accordance with example embodiments.

DESCRIPTION OF EMBODIMENTS

Hereinafter, one direction parallel to an upper surface of a substrate is referred to as a first direction, and a direction parallel to the upper surface of the substrate and perpendicular to the first direction is referred to as a second direction. A direction perpendicular to the upper surface of the substrate referred to as a "third", vertical, direction.

Figure 1:
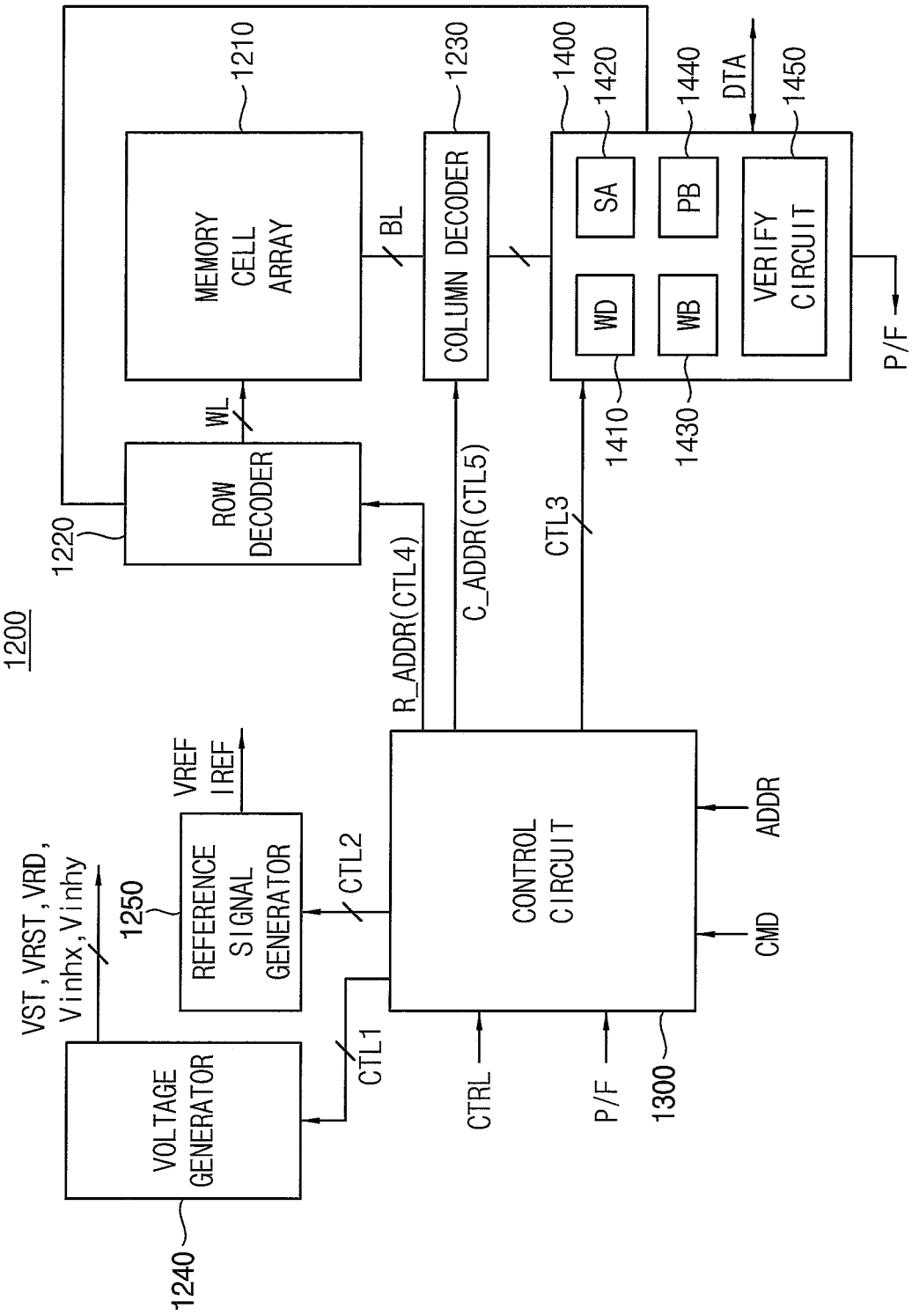
FIGS. 1 to 13 represent non-limiting, example embodiments as described herein.

FIG. 1 is a block diagram showing a memory device according to embodiments of the invention. Referring now to FIG. 1, a memory device 1200 may include a memory cell array 1210, a write/read circuit 1400, and a control circuit 1300. The memory device 1200 may further include a row decoder 1220, a column decoder 1230, a voltage generator 1240, and a reference signal generator 1250. Also, the write/read circuit 1400 may include a write driver 1410, a read circuit 1420 (e.g., sense amplifier circuit), a write buffer 1430, a page buffer 1440, and a verify circuit 1450.

Memory cells within the memory cell array 1210 may be connected to word lines WL and bit lines BL. As various voltage signals or current signals are supplied through the bit lines BL and the word lines WL, data in selected memory cells may be written to or read from; writing or reading of data in non-selected memory cells may also be prevented.

An address ADDR indicating an accessed memory cell may be received by the control circuit 1300 according to a command CMD. The address ADDR may include a row address R_ADDR for selecting the word lines WL in the memory cell array 1210 and a column address C_ADDR for selecting bit lines BL in the memory cell array 1210. The row decoder 1220 may perform a word line selection operation in response to the row address R_ADDR, and the column decoder 1230 may perform a bit line selection operation in response to the column address C_ADDR.

The write/read circuit 1400 may be connected to the bit lines BL. Thus, the write/read circuit 1400 may write data into the memory cell array, or may read data from the memory cell array. The write/read circuit 1400 may be connected to the row decoder 1220 and the column decoder 1230.

For example, during a write operation, a set voltage (VST) or a reset voltage (VRST) generated at the voltage generator 1240 may be supplied to the selected memory cell, and inhibit voltages Vinhx and Vinhy may be supplied to non-selected word lines and non-selected bit lines. During a read operation, a read voltage VRD generated at the voltage generator 1240 may be supplied to the selected memory cell. The write/read circuit 1400 may supply a write voltage or a write current according to data to the memory cell array 1210 through the column decoder 1230. The write/read circuit 1400 may include a verifying part for distinguishing data in the read operation. The verifying part may be connected to a node (e.g., a sensing node) of the bit line BL, and may compare a sensing voltage or a sensing current at the sensing node, so that data in the selected memory cell may be read. A reference voltage VREF and/or a reference current IRF generated at a reference signal generator 1250 may be supplied to the write/read circuit 1400, and thus the reference voltage VREF and/or the reference current IRF may be used for distinguishing data in the read operation.

The write/read circuit 1400 may supply a pass/fail signal P/F to the control circuit 1300. The pass/fail signal P/F may indicate whether the write operation or the read operation is successful or not. The control circuit 1300 may control the write operation and the read operation in the memory cell array 1110 with reference to the pass/fail signal P/F.

The control circuit 1300 may generate a plurality of control signals CTL1~CTL4 based on the command CMD, the address ADDR, the control signal CTRL, and the pass/fail signal P/F. A first control signal CTL1 may be supplied to the voltage generator 1240, the second control signal CTL2 may be supplied to the reference signal generator 1250, and the third control signal CTL3 may be supplied to the write/read circuit 1400. The fourth control signal CTL4 may be supplied (as a row address R_ADDR) to the row decoder 1220 and the fifth control signal CTL5 may be supplied (as a column address C_ADDR) to the column decoder 1230.

Figure 2:
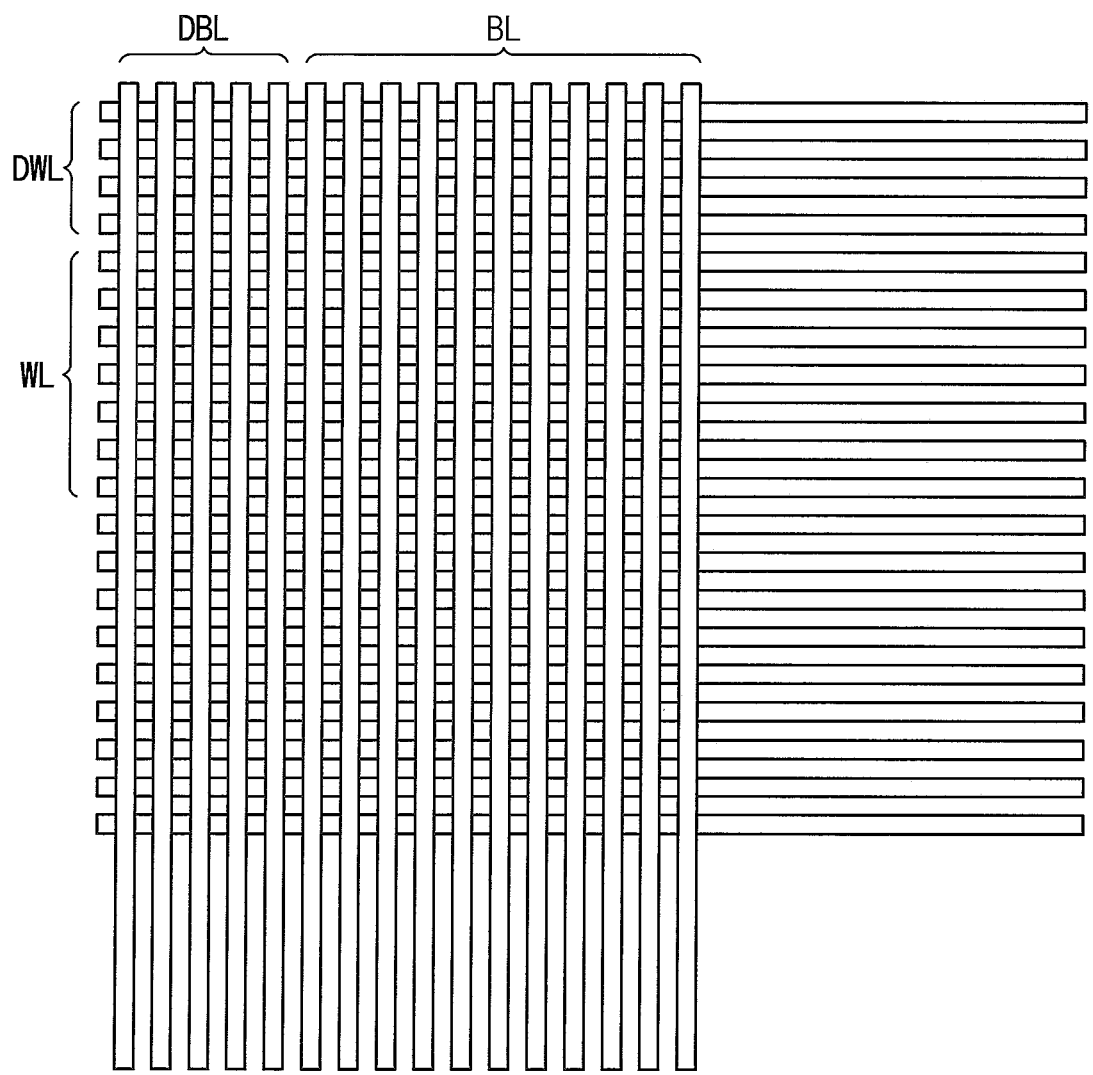
Figure 3:
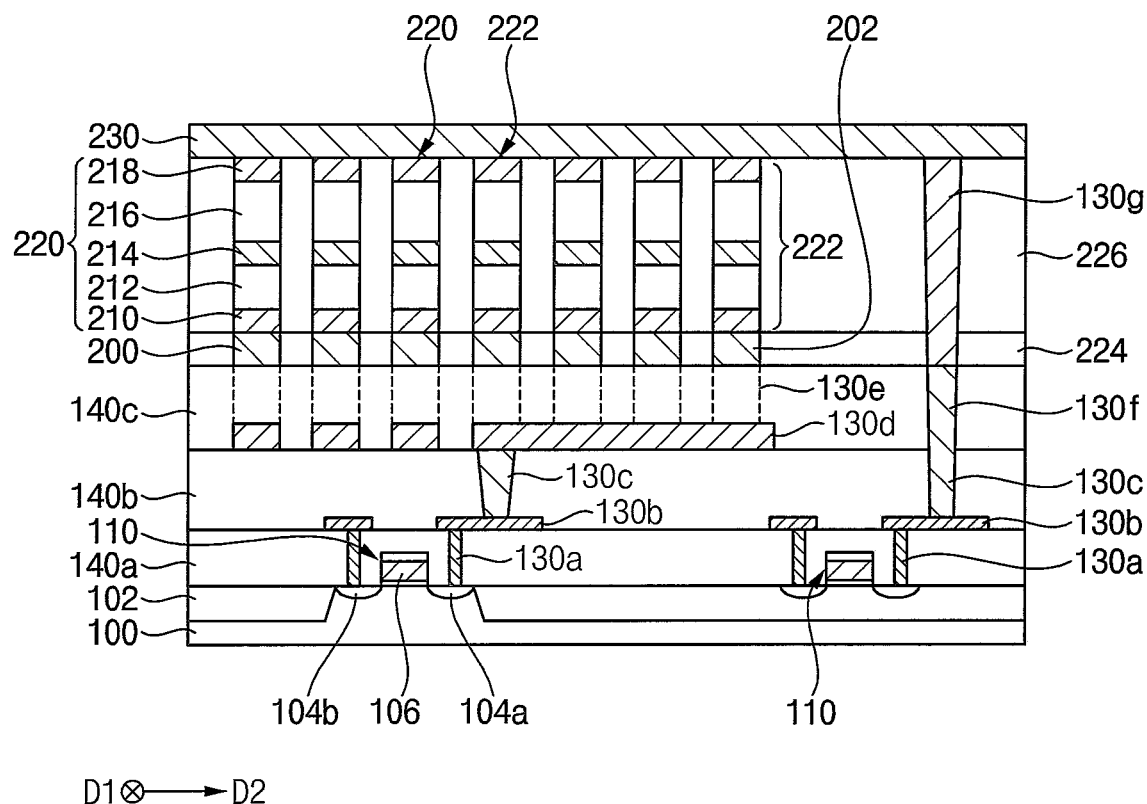
Figure 4:
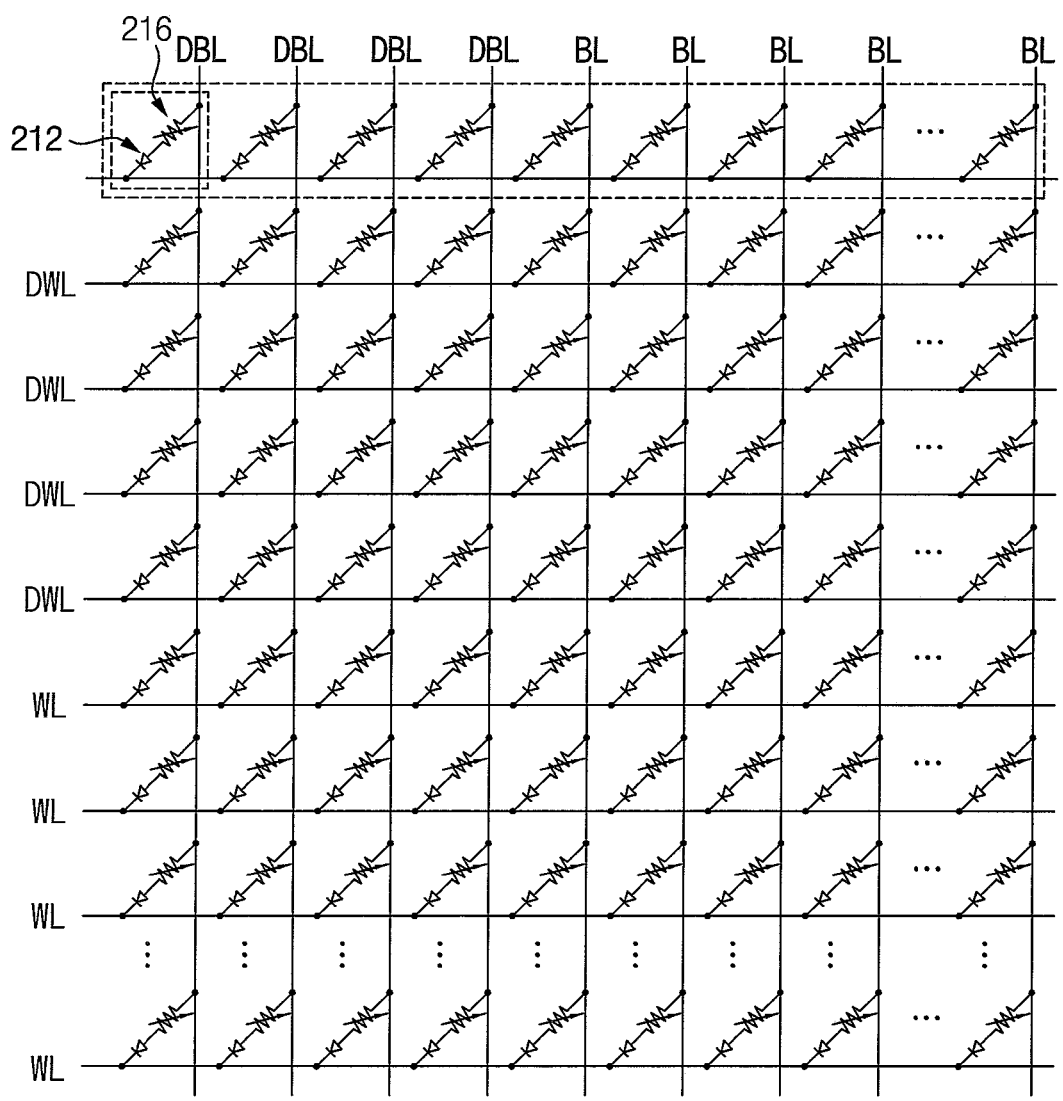

FIG. 2 is a schematic plan view illustrating a memory cell array in a variable resistance memory device in accordance with example embodiments. FIG. 3 is a cross-sectional view illustrating parts of a memory cell array and a peripheral circuit in a variable resistance memory device in accordance with example embodiments. FIG. 4 is a circuit diagram illustrating an example of a memory cell array in a variable resistance memory device in accordance with example embodiments.

The memory cell array may include a plurality of cell blocks. FIG. 4 shows one cell block. The variable resistance memory device may include a memory cell array 1210 (refer to FIG. 1) and peripheral circuits. The peripheral circuit may include, e.g., the write/read circuit 1400, the control circuit 1300, the row decoder 1220, the column decoder 1230, the voltage generator 1240, and the reference signal generator 1250 illustrated with reference to FIG. 1.

Referring to FIGS. 2 to 4, the memory cell array may include a plurality of word lines (WL) 200, a plurality of dummy word lines (DWL) 202, a plurality of bit lines (BL) 230, a plurality of dummy bit lines DBL, a plurality of memory cell structures 220, and a plurality of dummy memory cell structures 222. Also, the memory cell structures 220 connected to the same word line (WL) 200 may be defined as a page unit.

The variable resistance memory device may be formed on the substrate 100, as shown by FIG. 3. The substrate 100 may include a semiconductor material such as silicon, germanium, or silicon-germanium, or a group III-V semiconductor compound such as GaP, GaAs, or GaSb. In some example embodiments, the substrate 100 may be a silicon-on-insulator (SOI) substrate or a germanium-on-insulator (GOI) substrate.

The variable resistance memory device may have a cell over peripheral (COP) structure in which peripheral circuits formed on the substrate 100 and memory cells stacked over the peripheral circuits are included.

The substrate 100 may be divided into an active region and an isolation region. The isolation region may be a region where an isolation pattern 102 including an insulating material is formed to fill a trench (e.g., shallow trench) of the substrate 100. The active region and the device isolation region may be formed by an shallow trench isolation (STI) process in some embodiments.

Transistors 110 for configuring the peripheral circuits and first lower wirings 130a, 130b, 130c, 130d, and 130e for electrically connecting the transistors 110 may be formed on the substrate 100. The first lower wirings 130a, 130b, 130c, 130d, and 130e may include conductive patterns 130b and 130d, and contact plugs 130a, 130c and 130e. As shown by FIG. 3, the first lower wirings 130a, 130b, 130c, 130d, and 130e may have a multilayered structure.

Lower insulating interlayers 140a, 140b, and 140c may be formed to cover the peripheral circuits. An upper surface of each of the lower insulating interlayers 140a, 140b, and 140c may be substantially flat (e.g., planarized). And, the memory cell array may be formed on an uppermost lower insulating interlayer 140c. For example, the word lines 200 and dummy word lines 202 may be formed on the uppermost lower insulating interlayer 140c. The word lines 200 may extend in the first direction D1, and may be spaced apart from each other in the second direction D2.

The memory cell structures and the dummy memory cell structures constitute a cell block. In example embodiments, the dummy word lines 202 may be disposed at an edge portion of the cell block in the second direction. The dummy word lines 202 may extend in the first direction, and may be spaced apart from each other in the second direction. As shown by FIGS. 2 and 4, the dummy word lines DWL may be adjacent to the word lines WL disposed at the edge portion of the cell block in the second direction.

The bit lines 230 and dummy bit lines DBL may be formed over the word lines 200 and over the dummy word lines 202. The bit lines 230 and dummy bit lines DBL may be spaced apart from the word lines 200 and the dummy word lines 202 in the vertical direction. The bit lines 230 may extend in the second direction, and may be spaced apart from each other in the first direction.

In example embodiments, the dummy bit lines DBL may be disposed at an edge portion of the cell block in the first direction. The dummy bit lines DBL may extend in the second direction, and the dummy bit lines DBL may be spaced apart from each other in the first direction. The dummy bit lines DBL may be adjacent to the bit lines BL and 230 disposed at the edge portion of the cell block in the first direction.

When the word lines and the bit lines having fine widths and spaces are formed by a patterning process, the word lines and the bit lines disposed at edge portions may not be patterned to have a target line width and a target space due to an etching loading effect. Therefore, as described above, the plurality of the word lines and the bit lines disposed at the edge portion of the cell block may serve as the dummy word lines and the dummy bit lines, which are not actually operated. In FIG. 2, only four (4) dummy word lines DWL and four (4) dummy bit lines DBL are shown, but the number of the dummy word lines and the dummy bit lines may not be limited thereto. Each of the memory cell structures 220 may be disposed at a cross point of one of the word lines 200 and one of the bit lines 230; and each of the memory cell structures 220 may be electrically connected to one of the word lines 200 and one of the bit lines 230.

The memory cell structure 220 may include at least a selection device 212 and a variable resistor 216, which operates as a memory storage unit. In example embodiments, the memory cell structure 220 may include a stack of a lower electrode 210, the selection device 212, a middle electrode 214, the variable resistor 216, and an upper electrode 218. The memory cell structures 220 may serve as respective memory cells.

The variable resistor 216 may be referred to as a variable resistance device or a variable resistance material, and the selection device 212 may be referred to as a switching device, which is used to "access" the variable resistance device. In example embodiments, the lower electrode 210 may contact an upper surface of one of the word lines 200, and the upper electrode 218 may contact a lower surface of one of the bit lines 230. The variable resistor 216 may be disposed between the selection device 212 and one of the bit lines BL, and the variable resistor 216 may be electrically connected to the selection device 212 and the one of the bit lines 230. The selection device 212 may be disposed between the variable resistor 216 and one of the word lines 200, and the selection device 212 may be electrically connected to the variable resistor 216 and the corresponding word line 200.

Each of the dummy memory cell structures 222 may be connected to the dummy word lines 202 and/or the dummy bit lines DBL. Thus, corresponding dummy memory cell structures 222 may be disposed at a cross point of one of the dummy word lines 202 and one of the bit lines 230. Thus, the dummy memory cell structures 222 may be connected to corresponding dummy word lines 202 and corresponding bit lines 230. In addition, some of the dummy memory cell structure 222 may be disposed at a cross point of one of the word lines 200 and one of the dummy bit lines DBL. Furthermore, some of the dummy memory cell structures 222 may be disposed at a cross point of one of the dummy word lines 202 and one of the dummy bit lines DBL. Thus, corresponding ones of the dummy memory cell structures 222 may be connected to one of the dummy word lines 202 and one of the dummy bit lines DBL. As will be understood by those skilled in the art, the dummy memory cell structures 222 may serve as dummy memory cells in which data is not stored. Nonetheless, the dummy memory cell structures 222 provide other advantages, as described herein.

The dummy memory cell structure 222 may have a stacked structure substantially the same as a stacked structure of the memory cell structure 220. For example, the dummy memory cell structure 222 may include a vertical stack of the lower electrode 210, the selection device 212, the middle electrode 214, the variable resistor 216, and the upper electrode 218. The lower electrode 210 may include, for example, a metal nitride such as titanium nitride (TiNx), tungsten nitride (WNx), and tantalum nitride (TaNx), or a metal silicon nitride such as titanium silicon nitride (TiSiNx). The selection device 212 may include an OTS material which is switched by a difference between resistances according to an applied voltage while maintaining an amorphous state. In example embodiments, the OTS material may include germanium (Ge), silicon (Si), arsenic (As) and/or tellurium (Te), for example. Also, the OTS material may further include selenium (Se), sulfur (S), carbon (C), nitrogen (N), indium (In), boron (B), or similar material, for example. Thus, in some embodiments, the OTS material may include: AsTeGeSiIn, GeTe, SnTe, GeSe, SnSe, AsTeGeSiSbS, AsTeGeSiInP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, for example.

The variable resistor 216 may include a material whose resistance changes according to a phase change of the material structure. In example embodiments, the variable resistor 216 may include a chalcogenide-based material in which germanium (Ge), antimony (Sb) and/or tellurium (Te) are combined in a predetermined ratio. In example embodiments, the variable resistor 216 may include a super lattice in which germanium-tellurium (GeTe) and antimony-tellurium (SbTe) are repeatedly stacked. In example embodiments, the variable resistor 216 may include an IST including indium-antimony-tellurium or a BST including bismuth-antimony-tellurium. The variable resistor 216 may further include carbon (C), nitrogen (N), boron (B), oxygen (O), for example.

In example embodiments, the variable resistor 216 may include a perovskite-based material or a transition metal oxide. The perovskite-based material may include STO ($SrTiO_3$), BTO ($BaTiO_3$), PCMO ($Pr1-XCaXMnO_3$), for example. The transition metal oxide may include titanium oxide (TiOx), zirconium oxide (ZrOx), aluminum oxide (AlOx), hafnium oxide (HfOx), for example. These material may be used alone or in combination of two or more, according to some embodiments.

The middle electrode 214 and the upper electrode 218 may include a metal nitride such as titanium nitride (TiNx), tungsten nitride (WNx), tantalum nitride (TaNx), for example; however, in other embodiments, the middle electrode 214 may be omitted.

First and second insulating interlayers 224 and 226 may fill a space between the word lines 200 and the dummy word lines 202, and a space between the memory cell structures 220 and the dummy memory cell structures 222. Contact plugs 130f and 130g may pass through the first and second insulating interlayers 224 and 226 and the lower insulating interlayers 140b and 140c. Moreover, the contact plugs 130f and 130g may be electrically connected to the bit line 230 and the peripheral circuits on the substrate 100. The word lines WL and 200 may be connected to the transistors 110, respectively, by the first lower wirings 130a, 130b, 130c, 130d, and 130e, as shown. In contrast, the dummy word lines 202 may be merged into one by the first lower wirings 130a, 130b, 130c, 130d, and 130e. In example embodiments, at least two dummy word lines 202 may be merged into one by the first lower wirings 130a, 130b, 130c, 130d, and 130e, which means at least some of the dummy word lines may be electrically connected to each other. Furthermore, the merged dummy word lines may be connected to one of the transistors 110.

Figure 5:
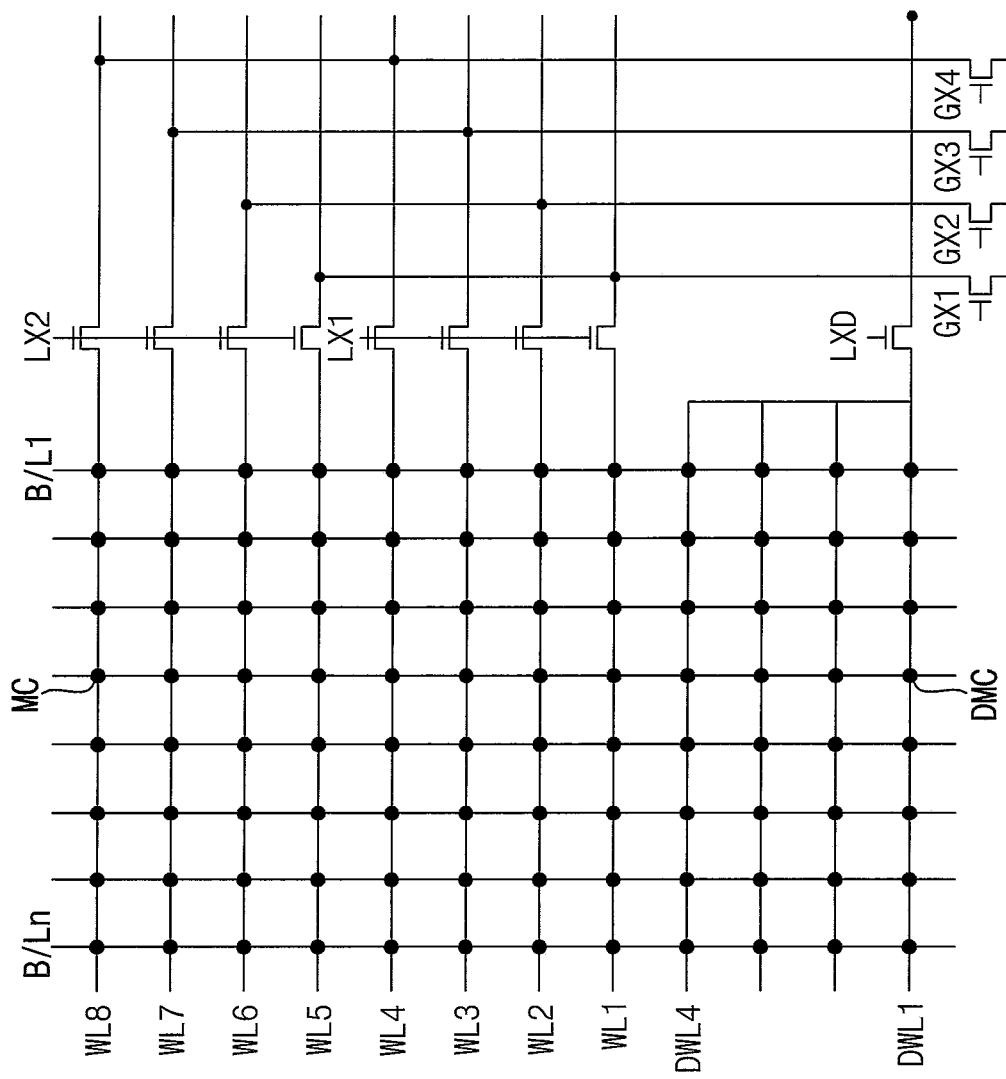

FIG. 5 is a circuit diagram of a portion of a variable resistance memory device in accordance with example embodiments. Particularly, FIG. 5 shows the dummy word lines and a part of the row decoder connected to the word lines. In FIG. 5, only eight (8) word lines and four (4) dummy word lines are shown for convenience of description. Referring to FIG. 5, memory cells MC may be connected to word lines WL1 to WL8 and bit lines BL1 to BLn. Dummy memory cells DMC may be connected to the dummy word lines DWL1 to DWL4 and to the bit lines BL1 to BLn. In FIG. 5, dummy bit lines are omitted to reduce a complexity of the drawing.

The memory cells MC and the dummy memory cells DMC may have a stacked structure, which is the same as the memory cell structure 220 and the dummy memory cell structure 222 described above. The row decoder may include a pre-decoder (not shown), row selection transistors LX1 and LX2, global row selection transistors GX1 to GX4, and a first transistor GXq1. The first transistor GXq1 may be electrically connected to a data sensing node SDL and a negative voltage VNEG.

Hereinafter, each of the transistors may include a gate structure 106 (refer to FIG. 3), a first impurity region 104a (refer to FIG. 3), and a second impurity region 104b (refer to FIG. 3). The first and second impurity regions 104a and 104b may serve as source/drain regions. In example embodiments, the row selection transistors LX1 and LX2, the global row selection transistors GX1 to GX4, and the first transistor GXq1 may be NMOS transistors.

The word lines WL1 to WL8 may be connected to the first impurity regions of the row selection transistors LX1 and LX2, respectively. That is, one of the word lines WL1 to WL8 may be connected to the first impurity region of one of row selection transistors LX1 and LX2. Thus, the number of the row selection transistors LX1 and LX2 may be equal to the number of the word lines WL1 to WL8.

In example embodiments, the word lines WL1 to WL8 may include a first word line group WL1, WL2, WL3, and WL4, and a second word line group WL5, WL6, WL7, and WL8. Gates included in first row selection transistors LX1 connected to the first word line groups WL1, WL2, WL3, and WL4 may be electrically connected to each other, and the gates may be used in a common gate of the first row selection transistors LX1. Gates included in second row selection transistors LX2 connected to the second word line groups WL5, WL6, WL7, and WL8 may be electrically connected to each other, and the gates may be used in a common gate of the second row selection transistors LX2. For convenience, it is described that the number of the word lines included in one word line group is four, but may not be limited thereto. The number of the word lines included in one word line group may be more or less.

The second impurity regions of the row selection transistors LX1 and LX2 may be connected to the global row selection transistors GX1 to GX4, respectively. In example embodiments, the second impurity regions of the row selection transistors LX1 and LX2 connected to the word lines selected one by one in each of the word line groups may be connected to one of the global row selection transistors GX1 to GX4. That is, the second impurity region of each of the row selection transistors LX1 and LX2 may be commonly shared with the first impurity region of one of the global row selection transistors GX1 to GX4.

The second impurity regions of the global row selection transistors GX1 to GX4 may be electrically connected to each other, and the second impurity regions may be merged with each other. The second impurity regions may be connected to one first transistor GXq1.

For example, a case of selection of the first word line WL1 may be described. The first transistor GXq1 may be turned on. Among the global row selection transistors GX1 to GX4, the global row selection transistor GX1 may be turned on, and the other global row selection transistors GX2 to GX4 may be turned off. Also, the first row selection transistor LX1 may be turned on, and the second row selection transistor LX2 may be turned off. Therefore, the write driver 1410 may be connected to the first word line WL1. The write driver 1410 may be connected between the first transistor GXq1 and the negative voltage VNEG. Thus, the first word line WL1 may be connected to the negative voltage VNEG.

Ends in the first direction of the dummy word lines DWL1 to DWL4 may be merged into one merged word line. The merged dummy word line DWL1 to DWL4 may be connected to the first impurity region of one dummy row selection transistor LXD. That is, the plurality of dummy memory cells DMC electrically connected to the dummy word lines DWL1 to DWL4 may be electrically connected to the first impurity region of the dummy row selection transistor LXD. Therefore, a voltage may be applied to (or may not be applied to) the dummy word lines DWL1 to DWL4 according to switching of the dummy row selection transistor LXD. Further, the same voltage may be applied to all of the dummy word lines DWL1 to DWL4.

As described above, the ends of the dummy word lines DWL1 to DWL4 may not be connected to corresponding ones of a plurality of dummy row selection transistors; therefore, the number of the dummy row selection transistor LXD may not be equal to the number of the dummy word lines DWL1 to DWL4. For example, the number of the dummy row selection transistor LXD may be smaller than the number of the dummy word lines DWL1 to DWL4.

Particularly, the ends of the plurality of the dummy word lines DWL1 to DWL4 may be merged into one "merged" dummy word line. The merged dummy word line DWL1 to DWL4 may be connected to the one dummy row selection transistor LXD. Therefore, the number of circuits (e.g., transistors) connected to the dummy word lines DWL1 to DWL4 may be advantageously decreased. In addition, a horizontal area of the substrate for forming the transistors may be decreased, and thus a chip size of the variable resistance memory device may be decreased.

Figure 6:
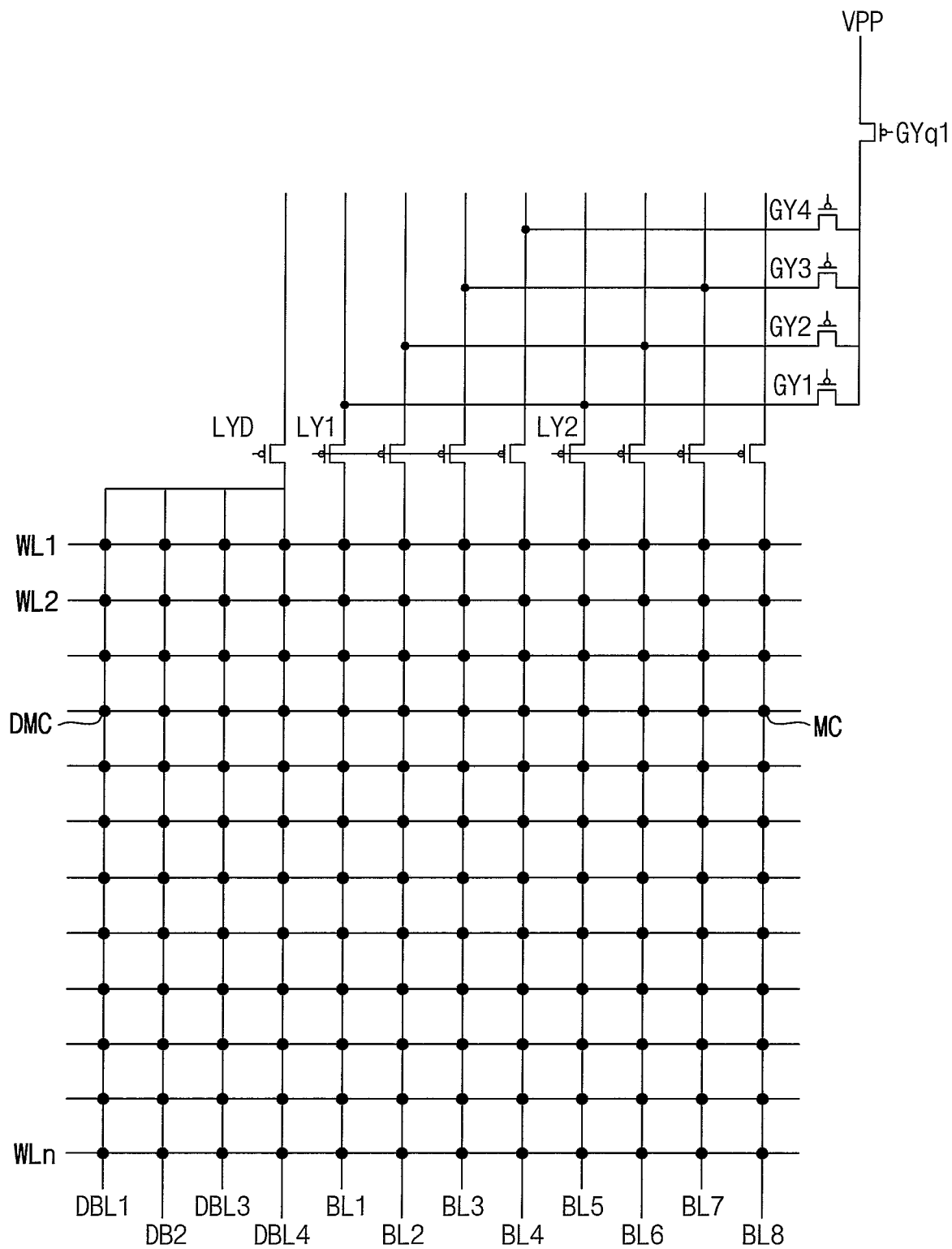

FIG. 6 is a circuit diagram of a portion of a variable resistance memory device in accordance with example embodiments. Particularly, FIG. 6 shows dummy bit lines and a part of a column decoder connected to the bit lines. In FIG. 6, only eight bit lines and four dummy bit lines are shown for convenience of description. Referring to FIG. 6, the memory cells MC may be connected to corresponding word lines WL1-WLn and corresponding bit lines BL1-BL8. And, the dummy memory cells DMC may be connected to the word lines WL1-WLn, and the dummy bit lines DBL1-DBL4. In FIG. 6, the dummy word lines are omitted to reduce drawing complexity.

The column decoder may include a pre-decoder, column selection transistors LY1 and LY2, global column selection transistors GY1 to GY4, and a second transistor GYq1. The second transistor GYq1 may be connected to the power voltage Vpp.

In example embodiments, the column selection transistors LY1 and LY2, the global column selection transistors GY1 to GY4, and the second transistor GYq1 may be PMOS transistors.

The bit lines BL1 to BL8 may be connected to the first impurity regions of the column selection transistors LY1 and LY2, respectively. That is, one of the bit lines BL1 to BL8 may be connected to the first impurity region of one of the column selection transistors LY1 and LY2. Therefore, the number of the column selection transistors LY1 and LY2 may be equal to the number of the bit lines BL1 to BL8.

In example embodiments, the bit lines BL1 to BL8 may include a first bit line group: BL1, BL2, BL3, and BL4, and a second bit line group: BL5, BL6, BL7, and BL8. Gates included in first column selection transistors LY1 connected to the first bit line group BL1, BL2, BL3, and BL4 may be electrically connected to each other, and the gates may be used in a common gate of the first column selection transistors LY1. Gates included in second column selection transistors LY2 connected to the second bit line group BL5, BL6, BL7, and BL8 may be electrically connected to each other, and the gates may be used in a common gate of the second column selection transistors LY2.

The second impurity regions of the column selection transistors LY1 and LY2 may be connected to the global column selection transistors GY1 to GY4, respectively. In example embodiments, the second impurity regions of the column selection transistors LY1 and LY2 connected to bit lines selected one by one in each of the bit line groups may be connected to one of the global column selection transistors GY1 to GY4. That is, the second impurity region of each of the column selection transistors LY1 and LY2 may be commonly shared with the first impurity region of one of the global column transistors GY1 to GY4.

The second impurity regions of the global column selection transistors GY1 to GY4 may be electrically connected to each other, and the second impurity regions may be merged with each other. The second impurity regions may be connected to one second transistor GYq1.

For example, a case of selection of the first bit line BL1 may be described. Among the global column selection transistors GY1 to GY4, the global column selection transistor GY1 may be turned on, and the other global column selection transistors GY2 to GY4 may be turned off. Also, the first column selection transistor LY1 may be turned on, and the second column selection transistor LY2 may be turned off. Therefore, the bit line BL1 may be connected to the power voltage Vpp.

Ends in the second direction of the dummy bit lines DBL1 to DBL4 may be merged into one merged dummy bit line. The merged dummy bit line DBL1 to DBL4 may be connected to the first impurity region of one dummy column selection transistor LYD. That is, a plurality of dummy memory cells DMC electrically connected to the dummy bit lines DBL1 to DBL4 may be electrically connected to the first impurity region of the dummy column selection transistor LYD. Therefore, a voltage may be applied to or may not be applied to the dummy bit lines DBL1 to DBL4 according to switching of the dummy column selection transistor LYD. Further, the same voltage may be applied to all of the dummy bit lines DBL1 to DBL4.

As described above, the ends of the dummy bit lines DBL1 to DBL4 may not be connected to a plurality of dummy column selection transistors, respectively, and thus the number of the column selection transistor LYD may not be equal to the number of the dummy word lines DBL1 to DBL4. The number of the dummy column selection transistor LYD may be smaller than the number of the dummy bit lines DBL1 to DBL4.

Particularly, the ends of the dummy bit lines DBL1 to DBL4 may be merged into one merged dummy bit line. The merged dummy bit line DBL1 to DBL4 may be connected to the one dummy column selection transistor LYD. Therefore, the number of circuits (e.g., transistors) connected to the dummy bit lines DBL1 to DBL4 may be advantageously decreased; and a horizontal area of the substrate for forming the transistors may also be decreased.

As described above, the dummy memory cells may be formed to be connected with the dummy word lines and/or dummy bit lines. The number of transistors connected to the dummy memory cells may be decreased. Therefore, a chip size of the variable resistance memory device may be decreased.

Hereinafter, an effect of reducing the chip size of the variable resistance memory device may be described with reference to a layout diagram. FIGS. 7 to 11 are layout diagrams illustrating a part of a variable resistance memory device. FIGS. 7 to 11 show a dummy word line, a dummy row selection transistor, a word line, and a row selection transistor. Wirings and interconnects shown in FIGS. 7 to 11 may be a part of the first lower wirings illustrated with reference to FIG. 3.

In FIGS. 7 to 11, only four (4) word lines and four (4) dummy word lines are shown for convenience of description; however, the number of the word lines and the number of dummy word lines is not limited thereto. The row selection transistors and dummy row selection transistors may be disposed in the same manner, even if a larger number of the word lines and the dummy word lines are provided.

Figure 7:
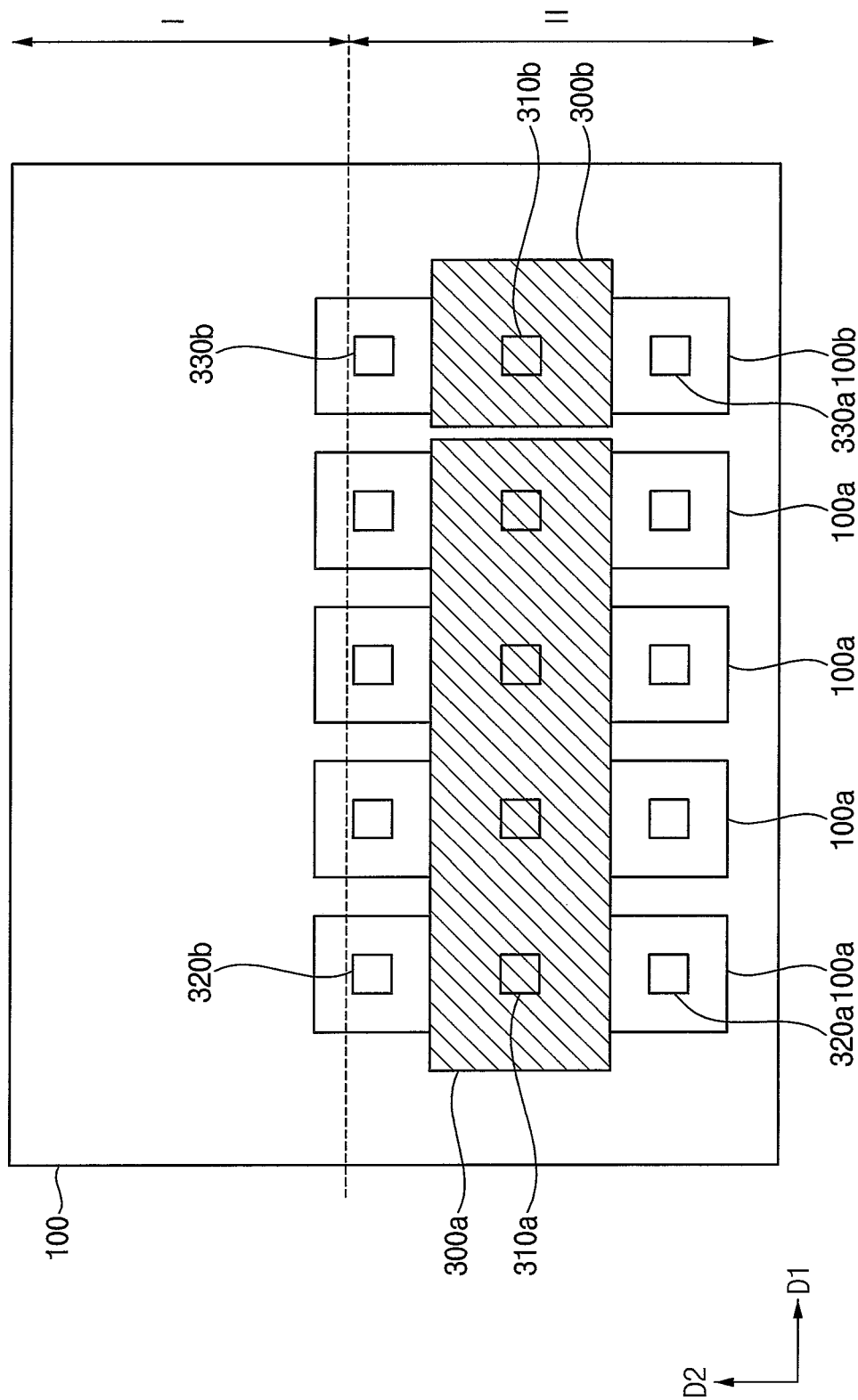

FIG. 7 shows an arrangement of transistors formed on a substrate and contact plugs connected to the transistors. Referring to FIG. 7, a substrate 100 may be divided into active regions 100a and 100b and an isolation region. In example embodiments, the active regions 100a and 100b may have an isolated shape, and the active regions 100a and 100b may be arranged such that the second direction is a length direction. A plurality of active regions 100a and 100b may be spaced apart from each other in the first direction, and the active regions 100a and 100b may be arranged in the first direction. The number of the active regions 100a and 100b arranged in the first direction may be one more than the number of the word lines. As shown in FIG. 7, when four (4) word lines are formed, five active regions 100a and 100b may be disposed in the first direction.

The word lines and the dummy word line may be disposed to be spaced apart from an upper surface of the substrate 100. A portion of the substrate 100 facing the word lines is referred to as a word line region II, and a portion of the substrate 100 facing the dummy word line is referred to as a dummy word line region I.

An active region electrically connected to the word line is referred to as a first active region 100a, and an active region electrically connected to the dummy word line is referred to as a second active region 100b. For example, only one second active region 100b may be disposed.

The first and second active regions 100a and 100b may be positioned at least in the word line region II and the dummy word line region I of the substrate 100. That is, the first and second active regions 100a and 100b may be disposed on the substrate 100 faced to a region for forming the memory cells. However, the first and second active regions 100a and 100b may not be positioned outside the word line region I and the dummy word line region II of the substrate 100. An end in the second direction of each of the first and second active regions 100a and 100b may be disposed so as not to deviate from at least an end in the second direction of the dummy word line region I.

As shown in FIG. 7, the first and second active regions 100a and 100b may be mainly disposed in the word line region II of the substrate 100. In example embodiments, the first and second active regions 100a and 100b may be disposed in the word line region II and a portion of the dummy word line region I adjacent to a boundary between the word line region II and the dummy word line region I. In some example embodiments, the first and second active regions 100a and 100b may be disposed only in the word line region of the substrate, and may not be disposed in the dummy word line region.

A first gate structure 300a may be disposed to cross the plurality of first active regions 100a, and the first gate structure 300a may extend in the first direction. A second gate structure 300b may be disposed to cross the second active region 100b. The first and second gate structures 300a and 300b may be spaced apart from each other in the first direction.

The first gate structure 300a may have a structure in which a gate insulation layer, a first gate electrode, and a mask pattern are stacked. The second gate structure 300b may have a structure in which a gate insulation layer, a second gate electrode, and a mask pattern are stacked.

A first impurity region and a second impurity region may be formed in the first active regions 100a adjacent to both sides of the first gate structure 300a. Therefore, MOS transistors (e.g., NMOS transistors) may be formed at each of the first active regions 100a. As shown in FIG. 7, four MOS transistors may be formed, and one first gate electrode may serve as a common gate electrode of the four MOS transistors. For example, the MOS transistor formed on the first active region 100a may correspond to the row selection transistors LX1 illustrated in FIG. 5. That is, the first active region 100a may be a region for forming the row selection transistors.

A first impurity region and a second impurity region may be formed in the second active regions 100b adjacent to both sides of the second gate structure 300b. Therefore, one MOS transistor may be formed in the second active region 100b. The MOS transistor formed on the second active region 100b may correspond to the dummy row selection transistor LXD illustrated in FIG. 5. That is, the second active region 100b may be a region for forming the dummy row selection transistor. A first lower insulating interlayer (not shown) may be formed on the substrate 100 to cover the first and second gate structures 300a and 300b.

First contact plugs 310a and a second contact plug 310b may pass through the first lower insulating interlayer and the mask pattern. The first contact plugs 310a may contact the first gate electrode, and the second contact plug 310b may contact the second gate electrode. Third contact plugs 320a and fourth contact plugs 320b may pass through the first lower insulating interlayer. The third contact plugs 320a may contact the first impurity region of the first active region 100a, and the fourth contact plugs 320b may contact the second impurity region of the first active region 100a. Fifth contact plugs 330a and a sixth contact plug 330b may pass through the first lower insulating interlayer. The fifth contact plugs 330a may contact the first impurity region of the second active region 100b, and the sixth contact plug 330b may contact the second impurity region of the second active region 100b. Preferably, upper surfaces of the first to sixth contact plugs 310a, 310b, 320a, 320b, 330a, 330b may be substantially coplanar with each other.

Figure 8:
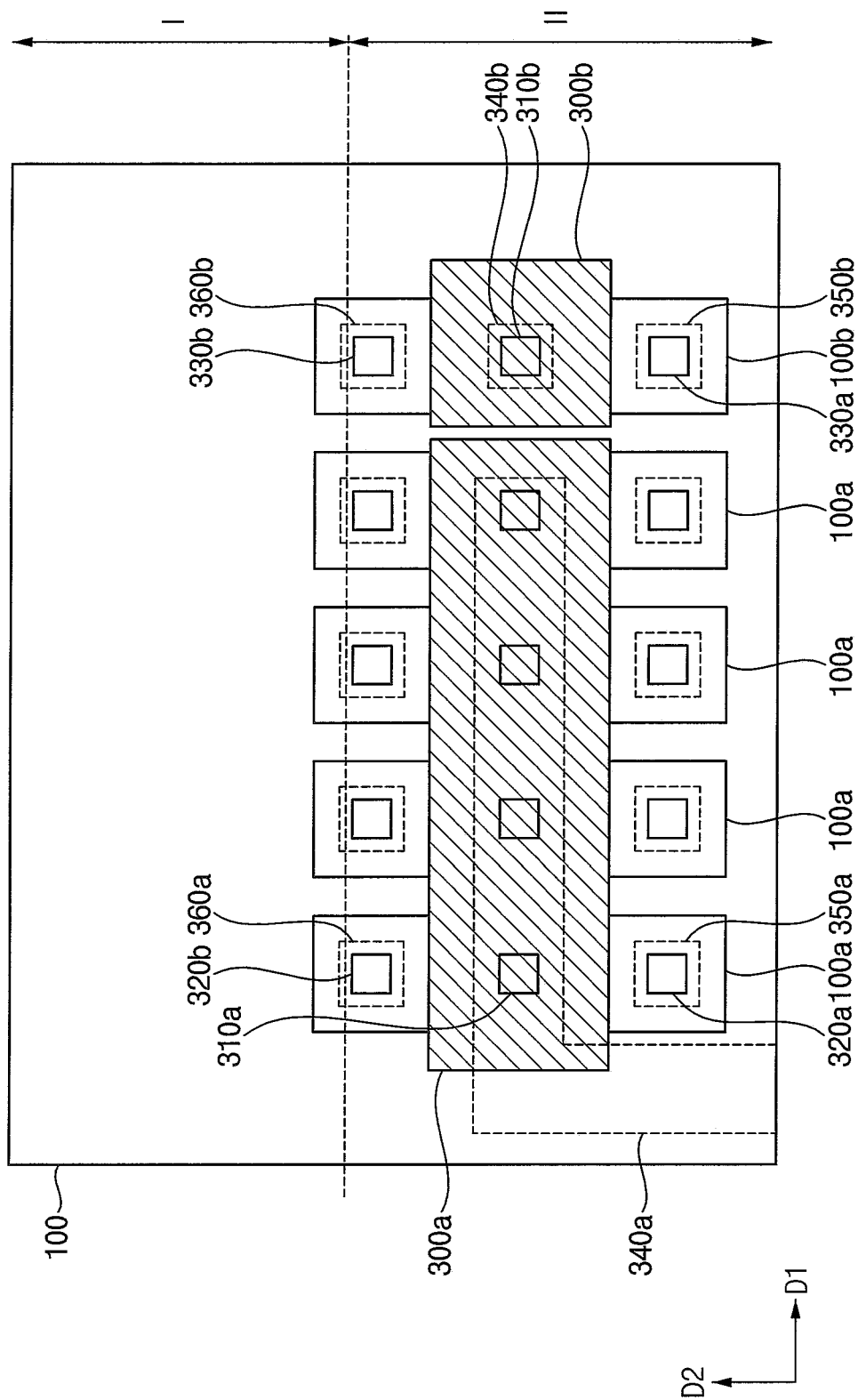

Referring to FIG. 8, a first wiring line 340a may be formed on the first contact plugs 310a, and the first wiring line 340a may be electrically connected to the first contact plugs 310a. The first wiring line 340a may include a first portion connecting the first contact plugs 310a arranged in the first direction and a second portion extending in the second direction from an end of the first portion. A second wiring 340b may be formed on the second contact plug 310b. First pad patterns 350a may be formed on the third contact plugs 320a, respectively. A second pad pattern 350b may be formed on the fifth contact plug 330a. Third wirings 360a may be formed on the fourth contact plugs 320b, respectively, and a fourth wiring 360b may be formed on the sixth contact plug 330b. Upper surfaces of the first wiring line 340a, the second to fourth wirings 340b, 360a, and 360b, and the first and second pad patterns 350a and 350b may be substantially coplanar with each other.

Figure 9:
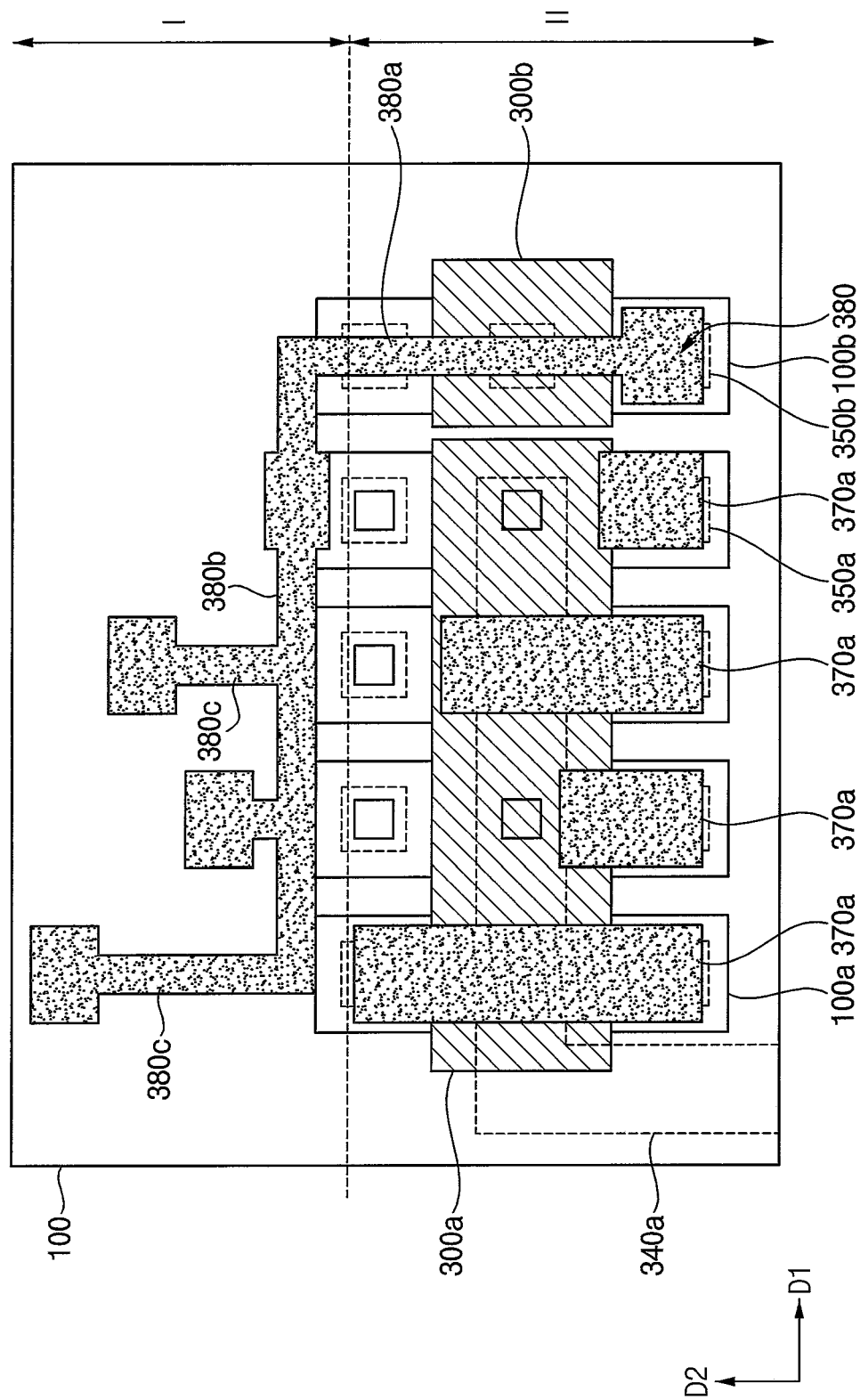

Referring to FIG. 9, third pad patterns 370a may be formed on the first pad patterns 350a, respectively. The third pad patterns 370a may be electrically connected to the first pad patterns 350a, respectively. Each of the third pad patterns 370a may be connected to a bottom of one of word lines thereon. Thus, each of the third pad patterns 370a may extend in the second direction to a lower portion of one of the word lines to be electrically connected. A bottom of a first end portion in the first direction of the third pad patterns 370a may contact on the first pad pattern 350a. In each of the third pad patterns 370a, an upper surface of a second end portion in the first direction opposite to the first end portion may be positioned to face the one of the word lines.

In example embodiments, a plurality of third pad patterns 370a may have different shapes (e.g., different lengths). The third pad patterns 370a may be spaced apart from each other in the first direction. A fourth pad pattern 380 may be formed on the second pad pattern 350b. The fourth pad pattern 380 may be electrically connected to the second pad pattern 350b. The fourth pad pattern 380 may be connected to bottoms of dummy word lines thereon. The fourth pad pattern 380 may extend to lower portions of the dummy word lines to be electrically connected. The fourth pad pattern 380 may include a first portion, a second portion and branch lines. In the fourth pad pattern 380, the first portion may be directly contact on the second pad pattern 350b, and may extend in the second direction. The second portion 380b may extend in the first direction from an end of the first portion. The branch lines 380c may extend in the second direction. Each of the branch lines 380c may extend from the second portion 380b to a lower portion of each of the dummy word lines. In example embodiments, the branch lines 380c may be disposed on the dummy word line region I. The first portion 380a, the second portion 380b, and the branch lines 380c may be connected with each other. Upper surfaces of the third and fourth pad patterns 370a and 380 may be substantially coplanar with each other, in some embodiments of the invention.

Figure 10:
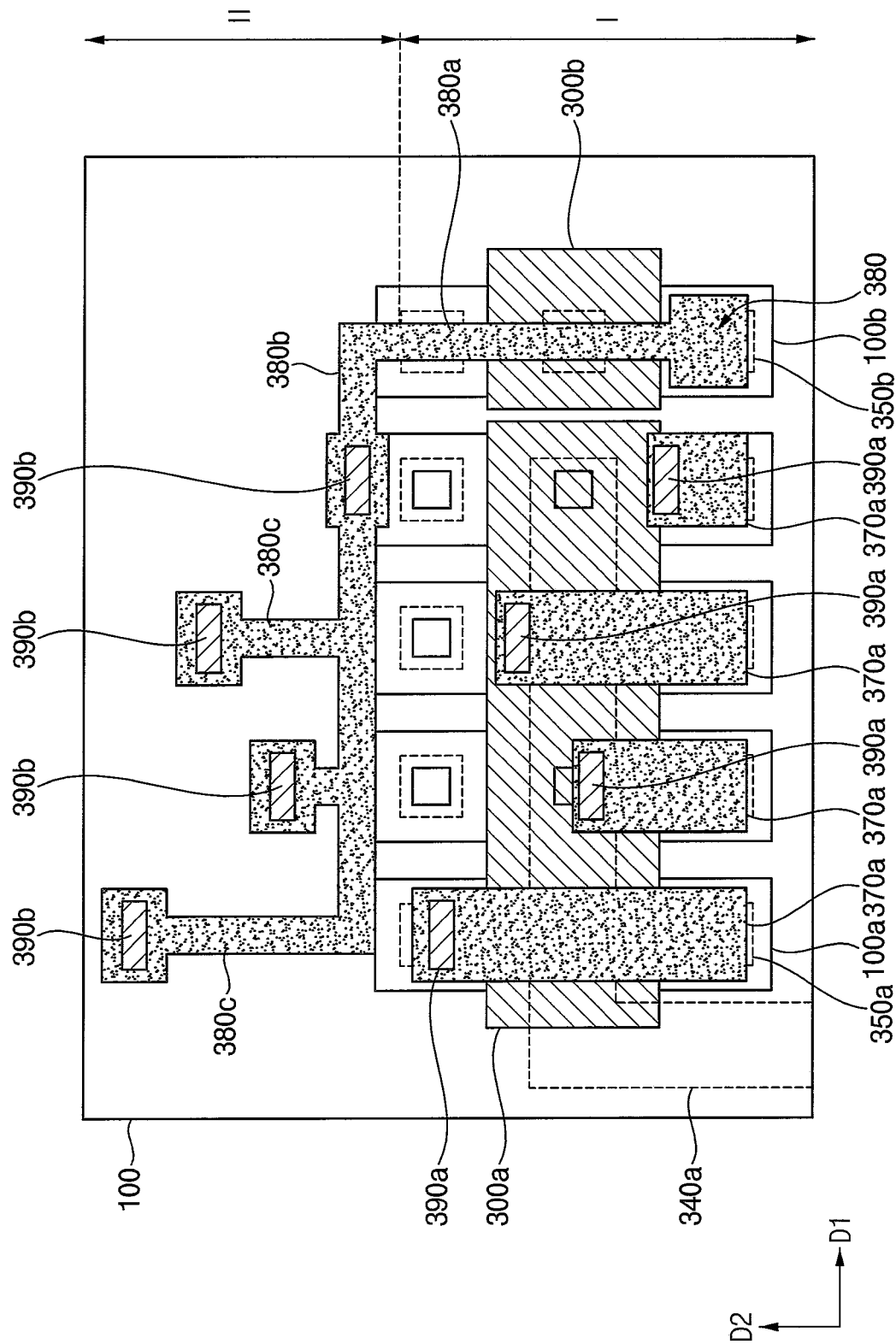

Referring to FIG. 10, seventh contact plugs 390a for contacting word lines may be formed on the third pad patterns 370a, respectively. Eighth contact plugs 390b for contacting dummy word lines may be formed on the fourth pad pattern 380. The seventh contact plugs 390a may be disposed to face portions for forming the word lines, respectively. In example embodiments, the seventh contact plugs 390a may be disposed on edge upper portions of the third pad patterns 370a, respectively. The eighth contact plugs 390b may be disposed to face portions for forming the dummy word lines, respectively. In example embodiments, the eighth contact plugs 390b may be disposed on edge upper portions of branch lines in the fourth pad pattern 380, respectively. However, the contact plugs connected to the word line or the dummy word line may not be disposed on the first portion in the fourth pad pattern 380.

Figure 11:
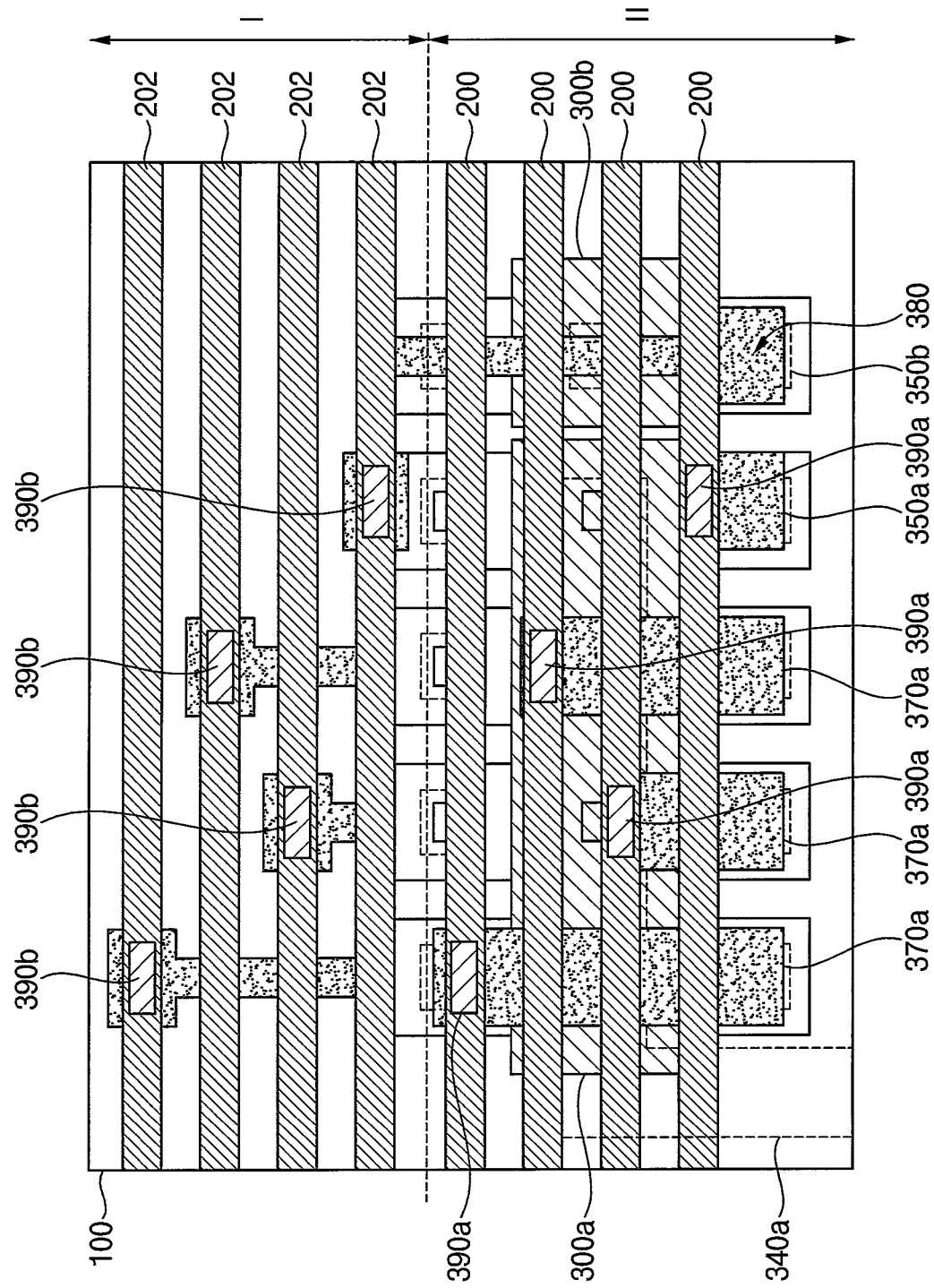

Referring to FIG. 11, the word lines 200 extending in the first direction may be formed on the seventh contact plugs 390a, respectively. The dummy word lines 202 extending in the first direction may be formed on the eighth contact plugs 390b, respectively. In particular, upper surfaces of the eighth contact plugs 390b may contact bottoms of the dummy word lines, respectively. The fourth pad pattern 380 may be connected to the eighth contact plugs 390b to each other, and may extend above the first impurity region of the second active region 100b. The second pad pattern 350b may contact a bottom of the fourth pad pattern 380, and the fifth contact plug 330a may be connected to the second pad pattern 350b and a first impurity region of the second active region 100b. Therefore, the plurality of the dummy word lines 202 may be electrically connected to the first impurity region of the second active region 100b through a second wiring structure, which includes the eighth contact plug 390b, the fourth pad pattern 380, the second pad pattern 350b, and the fifth contact plug 330a. Accordingly, the dummy word lines 202 may be electrically merged into one by the eighth contact plug 390b and the fourth pad pattern 380, and the dummy word lines 202 may be electrically connected to each other. The merged dummy word line 202 may be electrically connected to one selection transistor (e.g., a dummy row selection transistor).

The word lines 200 may be electrically connected to the first impurity regions of the first active regions 100a, respectively, through a first wiring structure including the seventh contact plug 390a, the third pad pattern 370a, the first pad pattern 350a, and the third contact plug 320a. Accordingly, one of the word lines 200 and one of the selection transistors (e.g., row selection transistors) may be electrically connected to each other by the first wiring structure. Therefore, the number of the word lines 200 may be equal to the number of the row selection transistors.

Although not shown, memory cell structures and dummy memory cell structures may be formed on the word lines 200 and the dummy word lines 202, as described with reference to FIGS. 2 to 4. Also, bit lines and dummy bit lines may be formed on the memory cell structures and the dummy memory cell structures. According to the above, a layout of the dummy word lines 202 and one dummy row selection transistor connected the dummy word lines 202 may be described with reference to FIGS. 7 to 11.

Similarly, the dummy bit lines may be merged into one another by wirings, such as the first lower wirings in FIG. 3, and the merged dummy bit line may be connected to one dummy column selection transistor. In this case, in the variable resistance memory device, circuits including the bit lines and the dummy bit lines may be configured as the circuit diagram shown in FIG. 6. The dummy bit lines and dummy column selection transistor may have a layout similar to a layout of the dummy word lines 202 and dummy row selection transistor illustrated in FIGS. 7 to 11. Further, wirings connected to the dummy bit lines may have a layout similar to the wirings (e.g., the second wiring structure) that are connected to the dummy word lines 202 illustrated in FIGS. 7 to 11. However, the dummy bit lines and bit lines may extend in the second direction.

Hereinafter, a method of operating the variable resistance memory device in accordance with example embodiments is briefly described. The row decoder and the column decoder may operate in response to a row address and a column address. Thus, one of the plurality of memory cells may be selected as a selection memory cell. In a data write operation, voltages for writing data in the selected memory cell may be supplied to a selected word line and a selected bit line, respectively. Thus, a variable resistor of the selected memory cell may have a high resistance state or a low resistance state. Further, first inhibit voltages Vinhx and Vinhy may be supplied to non-selected word lines and non-selected bit lines, respectively.

A first dummy voltage may be supplied to the dummy word lines. The first dummy voltage may be supplied to prevent leakage currents through the dummy memory cells, during writing data in the selected memory cell. The dummy row selection transistor may be turned on, and the same first dummy voltage may be supplied to the dummy word lines connected to the dummy row selection transistor.

During data read operation, voltages for reading data in the selected memory cell may be supplied to the selected word line and the selected bit line, respectively. Depending on the data written in the selected memory cell, currents may flow or may not flow through the selected memory cell.

Thus, data written in the selected memory cell may be read. Further, second inhibit voltages Vinhx and Vinhy may be supplied to non-selected word lines and non-selected bit lines, respectively.

A second dummy voltage may be supplied to the dummy word lines. The second dummy voltage may be supplied to prevent leakage currents through the dummy memory cells, during reading data in the selected memory cell. The dummy row selection transistor may be turned on, and the same second dummy voltage may be supplied to the dummy word lines connected to the dummy row selection transistor.

In the variable resistance memory device, the memory cell arrays may have a three-dimensional stacked structure. For example, FIGS. 12 and 13 are cross-sectional views illustrating a variable resistance memory device including memory cell arrays in accordance with example embodiments having a stacked structure.

Figure 12:
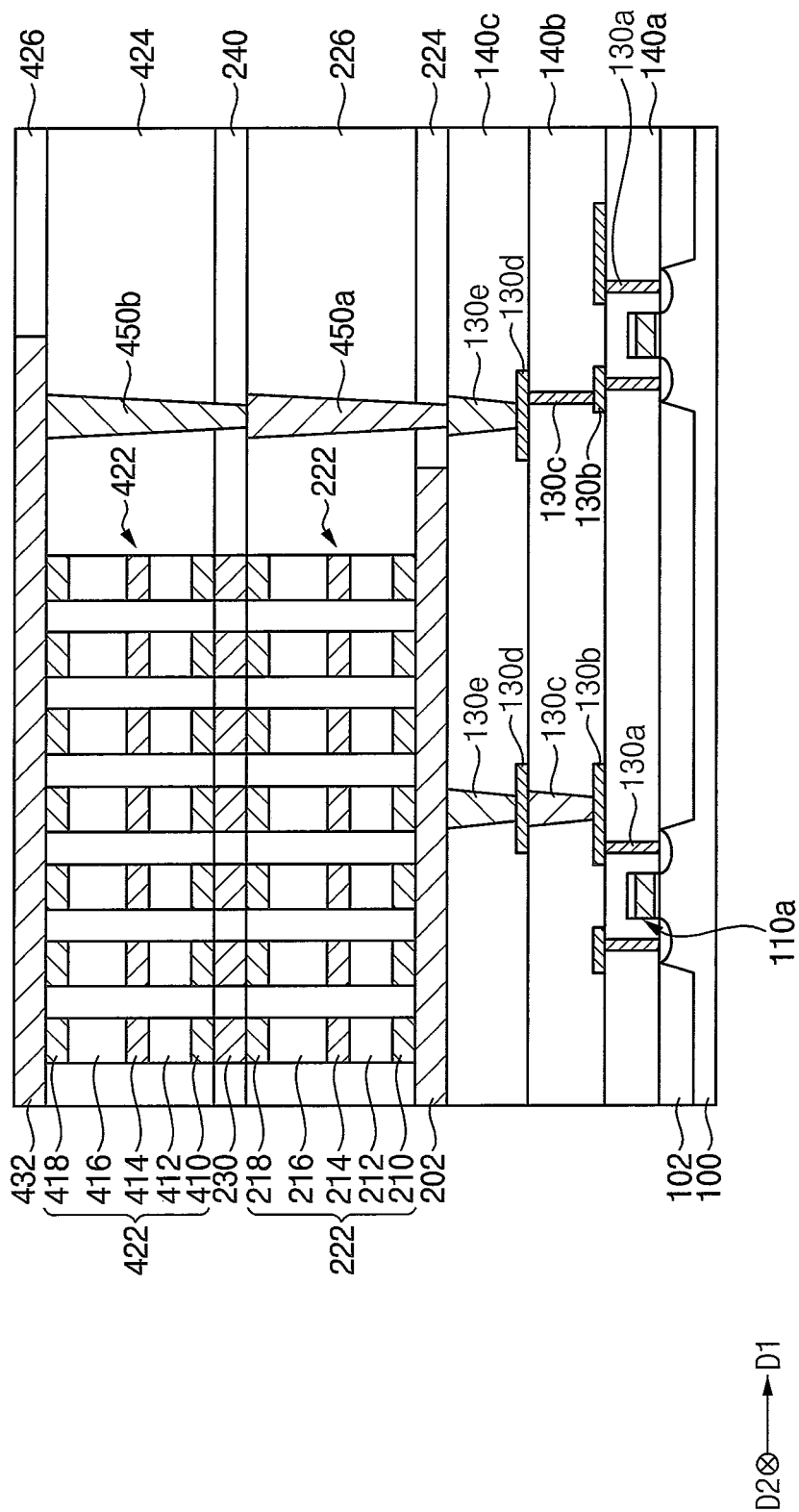
Figure 13:
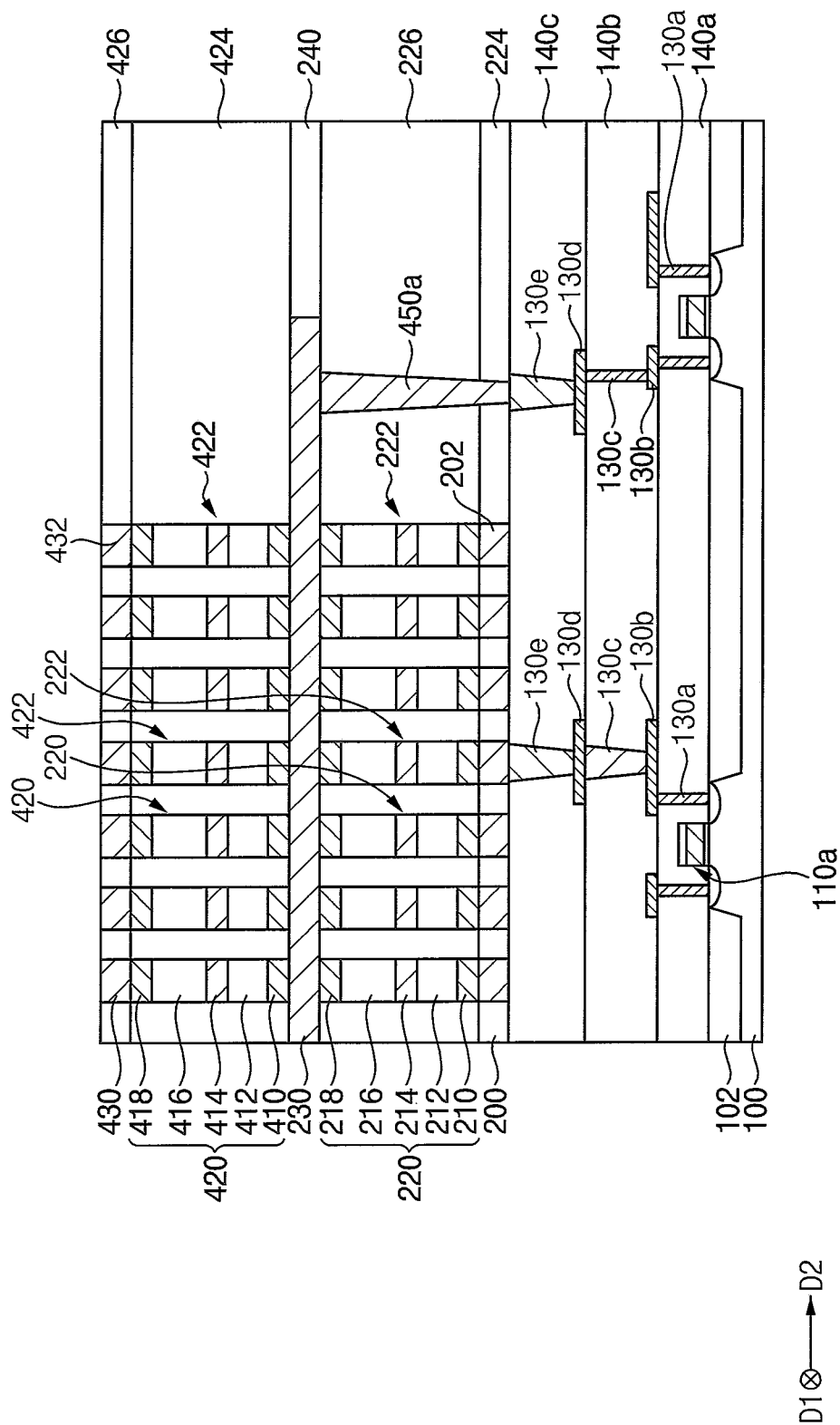

FIG. 12 is a cross-sectional view cutting in the first direction in the variable resistance memory device, and FIG. 13 is a cross-sectional view cutting in the second direction in the variable resistance memory device. FIG. 12 is a cross-sectional view taken along a dummy word line. Referring to FIGS. 12 and 13, transistors 110a, 110b, and 110c for configuring peripheral circuits may be formed on a substrate 100. First lower wirings 130a, 130b, 130c, 130d, and 130e may be formed to be electrically connected with the transistors 110a, 110b and 110c.

Lower insulating interlayers 140a, 140b, and 140c may be formed to cover the peripheral circuits. The memory cell arrays may be vertically stacked on an upper surface of an uppermost lower insulating interlayer 140c. First word lines 200 and first dummy word lines 202 may be formed on the uppermost lower insulating interlayer 140c. The first word lines 200 may extend in the first direction, and the first word lines 200 may be spaced apart from each other in the second direction.

Bit lines 230 and dummy bit lines (not shown) may be formed over the first word lines 200 and the first dummy word lines 202. The bit lines 230 and dummy bit lines may be spaced apart from the first word lines 200 and the first dummy word lines 202 in the vertical direction. The bit lines 230 may extend in the second direction, and the bit lines 230 may be spaced apart from each other in the first direction. Each of the first memory cell structures 220 may be disposed at a cross point of one of the first word lines 200 and one of the bit lines 230. The first dummy memory cell structures 222 may be connected to the first dummy word lines 202 and/or dummy bit lines.

The first word lines 200 and the first dummy word lines 202 may be substantially the same as the word lines and dummy word lines described with reference to FIGS. 2 to 4. The bit lines 230 and dummy bit lines may be substantially the same as the bit lines and dummy bit lines described with reference to FIGS. 2 to 4. Further, the first memory cell structures 220 and the first dummy memory cell structures 222 may be substantially the same as the memory cell structures and dummy memory cell structures described with reference to FIGS. 2 to 4.

In example embodiments, a layout of the first lower wirings connected to the first dummy word lines 202 may be substantially the same as the layout of the wirings connected to the dummy word lines described with reference to FIGS. 7 to 11.

Second memory cell structures 420 and second dummy memory cell structures 422 may be formed on the bit lines 230. Also, the second dummy memory cell structures 422 may be formed on the dummy bit lines. Second word lines 430 and second dummy word lines 432 may be formed on the second memory cell structures 420 and the second dummy memory cell structures 422.

The second word lines 430 and the second dummy word lines 432 may extend in the first direction, and the second word lines 430 and the second dummy word lines 432 may be spaced apart from each other in the second direction. The second word lines 430 may be disposed to be faced with the first word lines 200. The second dummy word lines 432 may be disposed to be faced with the first dummy word lines 202.

Each of the second memory cell structures 420 may be disposed at a cross point of one of the second word lines 430 and one of the bit lines 230. The second dummy memory cell structures 422 may be connected to the second dummy word lines 432 and/or dummy bit lines.

In example embodiments, the second memory cell structures 420 and the second dummy memory cell structures 422 may have a stacked structure the same as a stacked structure of the memory cell structures and dummy memory cell structures described with reference to FIGS. 2 to 4. For example, each of the second memory cell structure 420 and the second dummy memory cell structure 422 may include a second lower electrode 410, a second selection device 412, a second middle electrode 414, a second variable resistor 416 and a second upper electrode 418 stacked.

In some example embodiments, the second memory cell structures 420 and the second dummy memory cell structures 422, and the first memory cell structures 220 and first dummy memory cell structures may be symmetric with respect to the bit line 230. Moreover, as described above, the memory cell structures are vertically stacked, and the bit line 230 may be commonly used in the first and second memory cell structures 220 and 420.

The first and second insulating interlayers 224 and 226 may be formed to fill a space between the first word lines 200 and the first dummy word lines 202 and a space between the first memory cell structures 220 and the first dummy memory cell structures 222. Third and fourth insulating interlayers 240 and 424 may be formed to fill a space between the bit lines 230 and the dummy bit lines, and a space between the second memory cell structures 420 and the second dummy memory cell structures 422. A fifth insulating interlayer 426 may be formed to fill a space between the second word lines 430 and the second dummy word lines 432. Although not shown, upper metal wirings may be further formed on the second word lines 430, the second dummy word lines 432, and the fifth insulating interlayer 426.

Further, contact plugs 450a, as shown by FIG. 13, may pass through the first and second insulating interlayers 224 and 226, and the contact plugs 450a may be electrically connected to the bit line 230 and the dummy bit line and the peripheral circuits on the substrate 100. In addition, vertically stacked contact plugs 450a and 450b, which are shown by FIG. 12, may pass through the first to fourth insulating interlayers 224, 226, 240, and 424, and the contact plugs 450a and 450b may be electrically connected to the second word lines 430 and the second dummy word lines 432 and the peripheral circuits on the substrate 100.

The second word lines 430 may be electrically connected to transistors (e.g., second row selection transistors) on the substrate 100 through the contact plugs 450a and 450b and first lower wirings 130a, 130b, 130c, 130d, and 130e. The second dummy word lines 432 may contact the contact plugs 450a and 450b. The contact plugs 450a and 450b may be connected to each other by the first lower wirings 130a, 130b, 130c, 130d, and 130e. Therefore, the second dummy word lines 432 may be electrically connected to one transistor (e.g., the second dummy row selection transistor).

In example embodiments, the first lower wirings connected to the second dummy word lines 432 may have a layout substantially the same as a layout of the wirings connected to the dummy word lines described with reference to FIGS. 7 to 11. As described above, ends of the second dummy word lines 432 may not be connected to the second dummy row selection transistors, respectively, and thus the number of second dummy row selection transistor may not be equal to the number of the second dummy word lines 432. The number of second dummy row selection transistors may be smaller than the number of the second dummy word lines 432. Therefore, the number of circuits (e.g., transistors) electrically connected to the second dummy word lines may be decreased. A horizontal area of the substrate for forming the transistors may be decreased, and thus a chip size of the variable resistance memory device may be decreased.

In FIGS. 12 and 13, memory cell structures vertically stacked in two layers have been described. However, the memory cell structures may be repeatedly stacked in three or more layers in the same manner, according to further embodiments of the invention. Moreover, even if the memory cell structures are stacked in multi layers, the dummy word lines at the same level may be merged into one by wirings under the dummy word lines, and the dummy word lines at the same level may be connected to one transistor.

The embodiments may be used in a variable resistance memory device and a system including the same. Particularly, the embodiments may be used in electronic devices such as a memory card, a solid state drive (SSD), an embedded multimedia card (eMMC), a computer, a laptop, a cellular phone, and a smart phone. (smart phone), MP3 player, Personal Digital Assistants (PDA), Portable Multimedia Player (PMP), digital TV, digital camera, portable game console, navigation device, wearable device, Internet of things (IoT) devices, Internet of everything: (IoE) devices, e-books, virtual reality (VR) devices, augmented reality (AR) devices, or similar devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An integrated circuit memory device, comprising:
   a plurality of row selection transistors, on a substrate;
   a dummy row selection transistor, on the substrate;
   a plurality of word lines and a plurality of dummy word lines, on the substrate;
   a plurality of memory cells electrically connected to corresponding ones of the plurality of word lines;
   a plurality of dummy memory cells electrically connected to corresponding ones of the plurality of dummy word lines;
   a first wiring structure, which electrically connects a first one of the plurality of word lines to a first one of the plurality of row selection transistors;
   a second wiring structure, which electrically connects the plurality of dummy word lines together and to the dummy row selection transistor;
   a plurality of bit lines, which are spaced apart vertically from the plurality of word lines and the plurality of dummy word lines, and are electrically connected to corresponding ones of the plurality of memory cells; and
   a plurality of dummy bit lines, which are electrically connected to corresponding ones of the plurality of dummy memory cells, and electrically connected together.

2. The memory device of claim 1, further comprising a dummy column selection transistor having a source/drain region electrically connected to the plurality of dummy bit lines.

3. The memory device of claim 1, wherein the substrate includes first active regions in which the plurality of row selection transistors are formed, and a second active region in which the dummy row selection transistor is formed; and wherein the second wiring structure comprises: (i) a first contact plug electrically coupled to a source/drain region of the dummy row selection transistor, (ii) a pad pattern electrically connected to the first contact plug, and (iii) a plurality of second contact plugs extending between and electrically connecting the pad pattern to corresponding ones of the plurality of dummy word lines.

4. A variable resistance memory device, comprising:
   row selection transistors on a substrate;
   a dummy row selection transistor on the substrate;
   word lines and dummy word lines disposed over the row selection transistors and the dummy row selection transistor, the word lines and the dummy word lines extending in a first direction parallel to a surface of the substrate;
   bit lines over the word lines and the dummy word lines, the bit lines being spaced apart from the word lines and the dummy word lines in a vertical direction perpendicular to the surface of the substrate, the bit lines extending in a second direction perpendicular to the first direction;
   memory cell structures, each of the memory cell structures connected to one of the word lines and one of the bit lines;
   dummy memory cell structures, each of the dummy memory cell structures connected to one of the dummy word lines and one of the bit lines;
   a first wiring structure connecting one of the word lines and one of the row selection transistors to each other; and
   a second wiring structure connecting the dummy word lines and the dummy row selection transistor,
   wherein ends of the dummy word lines are merged into one by the second wiring structure.

5. The variable resistance memory device of claim 4, wherein the substrate includes first active regions for forming the row selection transistors and a second active region for forming the dummy row selection transistor.

6. The variable resistance memory device of claim 5, wherein the first active regions and the second active region are spaced apart in the first direction, and the first active regions and the second active region are arranged such that the second direction is a length direction.

7. The variable resistance memory device of claim 5, wherein the first and second active regions are positioned in a region of the substrate for forming the dummy word line and the word lines.

8. The variable resistance memory device of claim 5, wherein the row selection transistors comprise:
   a common first gate structure extending in the first direction to cross the first active regions; and
   first and second impurity regions in the first active regions adjacent to both sides of the common first gate structure.

9. The variable resistance memory device of claim 5, wherein the dummy row selection transistors comprise:
   a second gate structure extending in the first direction to cross the second active regions; and
   first and second impurity regions in the second active region adjacent to both sides of the second gate structure.

10. The variable resistance memory device of claim 5, wherein the second wiring structure comprises:
    second contact plugs contacting bottoms of the dummy word lines, respectively;
    a pad pattern extending over the second active region, the pad pattern connecting bottoms of the second contact plugs; and
    a first contact plug connecting a bottom of the pad pattern and the second active region to each other.

11. The variable resistance memory device of claim 10, wherein the pad pattern comprises:
    a first portion contacting the first contact plug, the first portion extending in the second direction;
    a second portion extending in the first direction from an end of the first portion; and
    branch lines extending from the second portion to the second contact plugs, respectively.

12. The variable resistance memory device of claim 5, wherein ends of the first active regions and the second active regions in the second direction are disposed so as not to deviate from at least an end in the second direction of a region of the substrate for forming the dummy word line.

13. The variable resistance memory device of claim 4, wherein the number of the dummy row selection transistor is smaller than the number of the dummy word lines.

14. The variable resistance memory device of claim 4, wherein the memory cell structures and the dummy memory cell structures constitute a cell block, and the dummy word lines are disposed at an edge portion of the cell block in the second direction.

15. The variable resistance memory device of claim 14, wherein the dummy word lines are disposed adjacent to the word line disposed at an edge portion in the second direction.

16. The variable resistance memory device of claim 4, further comprising:
    second word lines and second dummy word lines over the bit lines, the second word lines and the second dummy word lines being spaced from the bit lines in the vertical direction and extending in the first direction;
    second memory cell structures, each of the second memory cell structures connected to one of the second word lines and one of the bit lines;
    second dummy memory cell structures, each of the second dummy memory cell structures connected to one of the second dummy word lines and one of the bit lines; and
    second row selection transistors electrically connected to the second word lines, respectively; and
    a second dummy row selection transistor;
    wherein ends of the second dummy word lines are merged into one, and the second dummy row selection transistor is electrically connected to merged second dummy word lines.

17. The variable resistance memory device of claim 16, further comprising a third wiring, which is connected to the ends of the second dummy word lines and the second dummy row selection transistor.

18. The variable resistance memory device of claim 4, wherein the number of the row selection transistors is equal to the number of the word lines.

19. A variable resistance memory device, comprising:
    memory cells disposed at cross points of word lines and bit lines;
    dummy memory cells connected to dummy word lines;
    row selection transistors for controlling the word lines, the number of the row selection transistors being equal to the number of the word lines;
    a dummy row selection transistor for controlling the dummy word lines, the number of the dummy row selection transistor being smaller than the number of the dummy word lines;
    a first wiring connecting the word lines and the row selection transistors; and
    a second wiring connecting the dummy word lines and the dummy row selection transistor;
    wherein ends of the dummy word lines are merged into one, and the dummy row selection transistor is electrically connected to merged dummy word lines; and
    wherein the second wiring comprises:
      second contact plugs contacting bottoms of the dummy word lines, respectively;
      a pad pattern extending over one impurity region of the dummy row selection transistor, the pad pattern connecting bottoms of the second contact plugs; and
      a first contact plug connecting a bottom of the pad pattern and the one impurity region to each other.

20. The variable resistance memory device of claim 19, wherein each of the memory cells and the dummy memory cells are stacked in two or more layers in a vertical direction.

* * * * *